(12) United States Patent
Jing et al.

(10) Patent No.: US 11,109,516 B2
(45) Date of Patent: Aug. 31, 2021

(54) LIQUID-COOLED SERVER CHASSIS

(71) Applicant: Beijing Baidu Netcom Science and Technology Co., Ltd., Beijing (CN)

(72) Inventors: Tangbo Jing, Beijing (CN); Xiaogang Sun, Beijing (CN); Binghua Zhang, Beijing (CN)

(73) Assignee: BEIJING BAIDU NETCOM SCIENCE AND TECHNOLOGY CO., LTD, Beijing (CN)

( * ) Notice: Subject to any disclaimer, the term of this patent is extended or adjusted under 35 U.S.C. 154(b) by 333 days.

(21) Appl. No.: 16/126,938

(22) Filed: Sep. 10, 2018

(65) Prior Publication Data

US 2019/0166725 A1    May 30, 2019

(30) Foreign Application Priority Data

Nov. 24, 2017    (CN) .......................... 201711193708.3

(51) Int. Cl.
  *H05K 7/20*     (2006.01)
  *F28F 27/00*    (2006.01)

(52) U.S. Cl.
  CPC ......... *H05K 7/20818* (2013.01); *F28F 27/00* (2013.01); *H05K 7/203* (2013.01); *H05K 7/20318* (2013.01); *H05K 7/20327* (2013.01); *H05K 7/20381* (2013.01); *H05K 7/20809* (2013.01); *F28F 2265/12* (2013.01)

(58) Field of Classification Search
  CPC ............... H05K 7/20818; H05K 7/203; H05K 7/20809; H05K 7/20318; H05K 7/20327; H05K 7/20381; F28F 27/00; F28F 2265/12
  See application file for complete search history.

(56) References Cited

U.S. PATENT DOCUMENTS 4,493,010 A     1/1985   Morrison et al.
4,619,316 A *  10/1986   Nakayama ............ F28F 13/187
                                                165/104.33
(Continued)

FOREIGN PATENT DOCUMENTS

CN    103298312 A    9/2013
CN    103616940 A    3/2014
(Continued)

OTHER PUBLICATIONS

Notice of Reasons for Refusal dated Sep. 12, 2019, received for corresponding Japanese Application No. 2018-146365.
(Continued)

*Primary Examiner* — Ljiljana V. Ciric
(74) *Attorney, Agent, or Firm* — Kinney & Lange, P.A.

(57) ABSTRACT

A liquid-cooled server chassis includes: a case; one or more liquid-cooling modules, each liquid-cooling module including a housing, a gas outlet valve, and a liquid return valve, wherein the gas outlet valve and the liquid return valve are opened during operation of the liquid-cooling module, and the liquid-cooling module accommodates a single server and is filled with coolant during operation; a connector configured to connect the liquid-cooling module to a power source; and a circulation portion including an gas outlet pipe, a liquid return pipe, a vapor processing part, and a liquid collecting part.

15 Claims, 3 Drawing Sheets

(56) References Cited

U.S. PATENT DOCUMENTS

| | | | | |
|---|---|---|---|---|
| 4,694,378 A * | 9/1987 | Nakayama | ............ | H01L 23/427 165/80.4 |
| 4,704,658 A * | 11/1987 | Yokouchi | ............... | H05K 7/203 165/104.33 |
| 7,905,106 B2 * | 3/2011 | Attlesey | .................. | F28F 9/007 62/259.2 |
| 7,911,793 B2 * | 3/2011 | Attlesey | ............. | H05K 7/20236 361/699 |
| 7,957,144 B2 * | 6/2011 | Goettert | ............. | H05K 7/20809 361/699 |
| 8,089,764 B2 * | 1/2012 | Attlesey | ................ | H01L 23/473 361/699 |
| 8,179,677 B2 * | 5/2012 | Campbell | ............ | H05K 7/203 361/699 |
| 8,184,436 B2 | 5/2012 | Campbell et al. | | |
| 8,208,258 B2 * | 6/2012 | Campbell | ............ | H05K 7/2079 361/699 |
| 8,322,154 B2 * | 12/2012 | Campbell | ............ | F28D 15/06 62/199 |
| 8,369,090 B2 * | 2/2013 | Chester | .............. | H05K 7/20763 361/699 |
| 8,369,091 B2 * | 2/2013 | Campbell | ............ | H05K 7/203 361/699 |
| 8,435,738 B2 * | 5/2013 | Holmes | .................. | G01N 35/00 435/6.1 |
| 8,583,290 B2 * | 11/2013 | Campbell | .......... | G05D 23/1934 700/282 |
| 8,619,425 B2 * | 12/2013 | Campbell | ............ | H05K 7/203 361/699 |
| 8,713,955 B2 * | 5/2014 | Campbell | ............ | F25B 43/003 62/259.1 |
| 8,739,406 B2 * | 6/2014 | Campbell | .................. | F28F 3/12 29/890.07 |
| 8,783,052 B2 * | 7/2014 | Campbell | ............ | F25B 49/02 62/259.2 |
| 8,789,385 B2 * | 7/2014 | Campbell | ............ | F25B 40/00 62/259.2 |
| 8,797,740 B2 * | 8/2014 | Campbell | .......... | H05K 7/20836 361/701 |
| 8,817,465 B2 * | 8/2014 | Campbell | .......... | H05K 7/20709 361/679.5 |
| 8,817,474 B2 * | 8/2014 | Campbell | .......... | H05K 7/20836 361/699 |
| 8,833,096 B2 * | 9/2014 | Campbell | ............ | F25B 49/02 62/259.2 |
| 8,833,405 B2 * | 9/2014 | Phallen | .................. | F17C 13/04 141/67 |
| 8,955,346 B2 * | 2/2015 | Campbell | .......... | H05K 7/20836 62/259.2 |
| 8,964,390 B2 * | 2/2015 | Campbell | .............. | F28F 3/048 361/700 |
| 8,964,391 B2 * | 2/2015 | Campbell | .......... | H05K 7/20809 361/700 |
| 8,966,922 B2 * | 3/2015 | Campbell | .......... | H05K 7/20745 62/259.2 |
| 9,042,098 B2 * | 5/2015 | Campbell | ................ | F28F 9/00 361/701 |
| 9,049,800 B2 * | 6/2015 | Shelnutt | ............. | H05K 7/20318 |
| 9,095,942 B2 * | 8/2015 | Campbell | ............ | H05K 7/20809 |
| 9,110,476 B2 * | 8/2015 | David | ............ | H05K 7/20836 |
| 9,128,681 B2 * | 9/2015 | Attlesey | ................. | H05K 5/067 |
| 9,210,830 B2 * | 12/2015 | Campbell | ............ | H05K 7/203 |
| 9,223,360 B2 * | 12/2015 | Attlesey | .................. | F28D 15/02 |
| 9,271,429 B2 * | 2/2016 | Mashiko | ............. | F28D 20/021 |
| 9,273,906 B2 * | 3/2016 | Goth | .................. | H05K 7/20836 |
| 9,328,964 B2 * | 5/2016 | Shelnutt | ............. | F28D 15/0266 |
| 9,332,674 B2 * | 5/2016 | Campbell | .......... | H05K 7/20236 |
| 9,335,802 B2 * | 5/2016 | Shelnutt | ................ | H05K 7/203 |
| 9,351,429 B2 * | 5/2016 | Shelnutt | ................ | H05K 7/203 |
| 9,351,431 B2 * | 5/2016 | Campbell | .......... | H05K 7/20836 |
| 9,357,682 B2 * | 5/2016 | Campbell | .......... | H05K 7/20836 |
| 9,464,854 B2 * | 10/2016 | Shelnutt | ............. | H05K 7/20809 |
| 9,510,486 B1 * | 11/2016 | Gravina | ............. | H05K 7/20818 |
| 9,516,791 B2 * | 12/2016 | Chester | .................. | F25D 23/12 |
| 9,596,787 B1 * | 3/2017 | Iyengar | ............. | H05K 7/20318 |
| 9,872,415 B2 * | 1/2018 | Moss | ................ | H05K 7/20763 |
| 9,879,926 B2 * | 1/2018 | David | ................ | H05K 7/20836 |
| 9,883,697 B2 * | 2/2018 | Memari | ................ | A24F 15/015 |
| 9,901,013 B2 * | 2/2018 | Shedd | ................ | F25B 23/006 |
| 9,907,213 B1 * | 2/2018 | Gravina | ............. | H05K 7/20836 |
| 9,918,409 B2 * | 3/2018 | Edwards | ................ | F04D 13/12 |
| 9,921,622 B2 * | 3/2018 | Shelnutt | ................ | H05K 7/203 |
| 9,961,803 B2 * | 5/2018 | Samadiani | ......... | H05K 7/20836 |
| 9,968,010 B2 * | 5/2018 | Shelnutt | ............. | H05K 7/20781 |
| 9,992,914 B2 * | 6/2018 | Best | ................ | H05K 7/20836 |
| 10,018,425 B2 * | 7/2018 | Shelnutt | .................. | F28D 15/02 |
| 10,143,113 B2 * | 11/2018 | Shelnutt | .................. | F28B 9/06 |
| 10,244,655 B2 * | 3/2019 | Chainer | ............. | H05K 7/20318 |
| 10,579,112 B2 * | 3/2020 | North | ...................... | E05D 3/122 |
| 10,701,832 B2 * | 6/2020 | Chainer | ................ | G06F 1/206 |
| 10,801,747 B2 * | 10/2020 | Benefield | ................ | F24F 13/20 |
| 10,802,555 B2 * | 10/2020 | North | ................ | H05K 7/20381 |
| 10,802,556 B2 * | 10/2020 | North | ..................... | G06F 1/203 |
| 10,925,188 B1 * | 2/2021 | Keehn | ............. | H05K 7/20754 |
| 10,966,349 B1 * | 3/2021 | Lau | .................... | H05K 7/20236 |
| 10,969,842 B2 * | 4/2021 | Enright | ................ | H05K 7/1489 |
| 2004/0163403 A1 * | 8/2004 | Monfarad | ................ | F25B 1/00 62/259.2 |
| 2007/0227708 A1 * | 10/2007 | Hom | ......................... | G06F 1/20 165/121 |
| 2008/0225478 A1 * | 9/2008 | Goettert | ............. | H05K 7/20781 361/679.53 |
| 2012/0018139 A1 * | 1/2012 | Chen | ...................... | F28F 9/262 165/200 |
| 2012/0127657 A1 * | 5/2012 | Keisling | ............ | H05K 7/20218 361/679.53 |
| 2013/0021746 A1 * | 1/2013 | Campbell | ............ | H05K 7/2079 361/679.47 |
| 2014/0060799 A1 * | 3/2014 | Eckberg | ............. | G05D 23/1932 165/287 |
| 2014/0123493 A1 * | 5/2014 | Campbell | ............... | F28D 15/02 29/890.03 |
| 2014/0133096 A1 * | 5/2014 | Campbell | .......... | H05K 7/20781 361/694 |
| 2014/0146466 A1 * | 5/2014 | Lau | ................... | H05K 7/20336 361/679.47 |
| 2014/0216686 A1 * | 8/2014 | Shelnutt | ................ | H05K 7/203 165/67 |
| 2014/0216688 A1 * | 8/2014 | Shelnutt | .................. | F28D 15/02 165/104.13 |
| 2014/0216711 A1 * | 8/2014 | Shelnutt | ................ | H05K 7/203 165/301 |
| 2014/0218858 A1 * | 8/2014 | Shelnutt | ............. | H05K 7/20827 361/679.31 |
| 2014/0218859 A1 * | 8/2014 | Shelnutt | ................ | G06F 1/206 361/679.46 |
| 2014/0218861 A1 * | 8/2014 | Shelnutt | ............. | H05K 7/20809 361/679.53 |
| 2014/0342201 A1 * | 11/2014 | Andres | ................ | H01G 11/18 429/62 |
| 2015/0060009 A1 * | 3/2015 | Shelnutt | ............. | H05K 7/20809 165/11.1 |
| 2015/0062806 A1 * | 3/2015 | Shelnutt | ............. | H05K 7/20309 361/679.53 |
| 2015/0070846 A1 * | 3/2015 | Shelnutt | ................ | H05K 7/203 361/700 |
| 2016/0044833 A1 * | 2/2016 | Krishnan | ............. | H05K 7/20818 361/679.53 |
| 2016/0113149 A1 * | 4/2016 | Krug, Jr. | ............. | H05K 7/20781 361/679.53 |
| 2016/0113150 A1 * | 4/2016 | Krug, Jr. | ............. | H05K 7/20781 165/104.13 |
| 2016/0116224 A1 * | 4/2016 | Shedd | ....................... | F28F 3/12 165/104.22 |
| 2016/0120019 A1 * | 4/2016 | Shedd | ....................... | F28F 9/26 361/679.47 |
| 2016/0234970 A1 | 8/2016 | Shelnutt et al. | | |
| 2016/0330873 A1 * | 11/2016 | Farshchian | ........ | H05K 7/20809 |
| 2017/0010049 A1 * | 1/2017 | Agostini | ................ | F28D 15/04 |

(56) References Cited

U.S. PATENT DOCUMENTS

| | | |
|---|---|---|
| 2017/0064862 A1 | 3/2017 | Miyoshi |
| 2017/0112017 A1* | 4/2017 | Wang .................. F28D 15/06 |
| 2017/0164522 A1* | 6/2017 | Wong ................ H05K 7/20745 |
| 2017/0177041 A1* | 6/2017 | Shelnutt .................. G06F 1/20 |
| 2017/0181321 A1* | 6/2017 | Shelnutt ............ H05K 7/20781 |
| 2017/0181322 A1* | 6/2017 | Shelnutt ............ H05K 7/20627 |
| 2017/0181325 A1* | 6/2017 | Shelnutt ............ H05K 7/20272 |
| 2017/0181326 A1* | 6/2017 | Shelnutt ............ H05K 7/20772 |
| 2017/0181327 A1* | 6/2017 | Shelnutt ............ H05K 7/20781 |
| 2017/0181329 A1* | 6/2017 | Shelnutt .............. H05K 7/2079 |
| 2017/0265336 A1 | 9/2017 | Ichinose et al. |
| 2017/0303443 A1* | 10/2017 | Inano .................... G06F 1/206 |
| 2017/0325355 A1 | 11/2017 | Lau |
| 2018/0092251 A1* | 3/2018 | Tung ................ H05K 7/20418 |
| 2018/0139870 A1* | 5/2018 | Meadows ............ F28D 1/0443 |
| 2018/0270989 A1* | 9/2018 | Chainer ................ G06F 1/206 |
| 2019/0230816 A1* | 7/2019 | Chainer ............ H05K 7/20509 |
| 2019/0277530 A1* | 9/2019 | Schwegler ........... F24F 11/0008 |
| 2021/0120705 A1* | 4/2021 | Enright ............. H05K 7/20836 |

FOREIGN PATENT DOCUMENTS

| | | |
|---|---|---|
| CN | 204810780 U | 11/2015 |
| CN | 105431020 A | 3/2016 |
| CN | 106211705 A | 12/2016 |
| CN | 107046793 A | 8/2017 |
| WO | 2014039212 A1 | 3/2014 |
| WO | 2016088280 A1 | 6/2016 |
| WO | 2017055877 A1 | 4/2017 |

OTHER PUBLICATIONS

First Chinese Office Action dated Apr. 24, 2019, received for corresponding Chinese Application No. 201711193708.3.

Chinese Search Report dated Nov. 24, 2017, received for corresponding Chinese Application No. 201711193708.3.

Extended European Search Report dated Apr. 2, 2019, received received for corresponding European Application No. 18189841.2.

* cited by examiner

US 11,109,516 B2

LIQUID-COOLED SERVER CHASSIS

CROSS-REFERENCE TO RELATED APPLICATION(S)

The present application claims the benefit of priority to Chinese Patent Application No. 201711193708.3, filed before the State Intellectual Property Office on Nov. 24, 2017, and entitled "Liquid-Cooled Server Chassis", which is incorporated in the present application by reference in its entirety.

TECHNICAL FIELD

The present application relates to the field of servers, and in particular to a liquid-cooled server chassis.

BACKGROUND

With the prevalence of big data, cloud computing, and Artificial Intelligence (AI), the requirements for computing at data centers and servers are getting more and more challenging, and it is getting increasingly difficult for a computing architecture based on a CPU chip to satisfy the analysis and processing of big data and model training on artificial intelligence. In addition, heterogeneous computing systems such as GPUs (Graphic Processing Units), FPGAs (Field Programmable Gate Arrays), and ASICs (Application Specific Integrated Circuits) possess a great potential for development and an increasing power density, e.g. the power density of a single chip may reach 300 W and even 500 W or more, and the power density of a single cabinet may reach 40 or even 60 kW. In the traditional cooling technology for a data center, a precise air conditioner in the machine room is used and it exchanges heat with a cooler of a server computing chip with cooling air. Poor heat transfer properties of the air itself result in a high heat transfer resistance and a low heat flux density, which cannot satisfy the requirements for heat dissipation regarding the new type of high-density heterogeneous computing and super-computing at the data center. In addition, with the increasing energy costs and more attention paid to environmental protection, energy-saving requirements of the server and data center are increasingly strong. In a case of ensuring that equipment is safe and operates with high performance, increasing the energy efficiency of a data center and reducing PUE (Power Usage Efficiency) has become one of the goals of the data center infrastructure.

At a traditional data center, chilled water is supplied to the air-conditioning terminals by a refrigeration unit to continuously cool IT equipment. The energy consumption of the refrigeration unit accounts for about 40% of that of the data center. Obviously the energy consumption is severe. Although selecting a suitable low-temperature environment can achieve partially natural cooling (free cooling) through a heat exchanger bypass refrigeration unit to save energy, it requires additional investment and an additional area, and is limited by the geographical environment and the maximum air inlet temperature of the server, having a limited effect.

The liquid-cooling technology in which liquid is used directly to cool the server may achieve a higher heat exchange efficiency, thereby cooling a server chip completely without the refrigeration unit. It is also possible for the server chip to be operated at a higher temperature without being limited by the geographical location, and the PUE may reach 1.02 or even lower. Considering intrinsic challenges in a cold-plate liquid-cooling system of a water-immersed server, such as the risk of water leakage, many locations easily getting damaged, difficulty in maintenance and so on, the immersed liquid-cooling solution is the best way of cooling to achieve a high density and energy saving while being reliable.

In an existing immersed liquid-cooling solution, a server chip and other electronics are directly immersed into a non-conductive liquid to performing direct heat exchange, which may be performed by a single-phase fluorinated liquid or a mineral oil with a high boiling point, or by a two-phase fluorinated liquid with a low boiling point.

During heat exchange of the single-phase immersed cooling, a convection manner is used, and there are the drawbacks such as uneven flow field, a low heat exchange efficiency (compared to two-phase immersed cooling), a low bottleneck of heat dissipation, and towing loss during the maintenance of an IT equipment (that is, the surface of the IT equipment is stained with liquid and it is difficult for the liquid to evaporate quickly, which takes several hours to completely dry the IT equipment and affects normal maintenance of the server).

The two-phase immersed liquid-cooling system is more promising since in such a system, phase-change cooling is performed efficiently and uniformly, there is no towing loss during maintenance (the liquid on the surface of the IT equipment evaporates quickly) and the maintenance is convenient.

However, in the existing two-phase immersed liquid-cooled solution, a plurality of IT servers are arranged in a large case ("pool") and it requires a large amount of liquid to fill in the structural gaps in the case. However, the non-conductive fluorinated liquid is very expensive, which greatly increases the initial investment in immersed liquid-cooled equipment, thus making it significantly higher than that regarding the traditional air-cooling serve and investment return rate being not desirable. Meanwhile, a huge case renders the fluorinated liquid of the surface layer able to evaporate quickly. Moreover, when a single IT server is under maintenance, other servers may have to be shut down too, otherwise there will be a greater amount of gas dissipation, which will greatly increase maintenance cost and manpower requirements. Therefore, this immersed liquid-cooled solution cannot be applied in a large scale.

SUMMARY

In view of this, embodiments of the present disclosure are intended to provide a liquid-cooled server chassis to solve or alleviate the technical problems existing in the related art, and at least to provide a beneficial choice.

The technical solution of the embodiment of the present disclosure is implemented as below:

According to an embodiment of the present disclosure, a liquid-cooled server chassis is provided, including:

a case;

one or more liquid-cooling modules, wherein each liquid-cooling module includes: a housing, an gas outlet valve, and a liquid return valve, wherein the gas outlet valve and the liquid return valve are opened when the liquid-cooling module is in operation, and the liquid-cooling module is inserted with a single server during operation and is filled with coolant;

a connector for connecting the liquid-cooling module to an external power source; and a circulation portion includes an gas outlet pipe, a liquid return pipe, a vapor processing part, and a liquid collecting part, wherein, the gas outlet pipe is connected to the gas outlet valve and is used to transport gas from the liquid-cooling module to the vapor processing part;

the liquid return pipe is connected to the liquid return valve and is used to transport liquid from the liquid collecting part to the liquid-cooling module;

the vapor processing part is provided with a condenser for cooling the gas in the vapor processing part; and the liquid collecting part is used for collecting liquid from the vapor processing part.

In some embodiments, the chassis further includes a power supply and control system including a power source and a controller, wherein, the power source is connected to the connector for supplying power to other components in the chassis through the connector; and the controller is used to control other components in the chassis.

In some embodiments, the vapor processing part further includes a pressure relief valve, and gas in the vapor processing part can be discharged to the outside through the pressure relief valve.

In some embodiments, the pressure relief valve is further connected to an external air bag for collecting the gas discharged from the pressure relief valve.

In some embodiments, the case further includes a liquid filling valve connected to the liquid collecting part, and the liquid collecting part may be supplemented with coolant by the liquid filling valve.

In some embodiments, each liquid-cooling module further includes a first sensor connected to the controller and configured to detect a liquid level of the coolant in the liquid-cooling module; wherein, when the liquid level of the coolant in the liquid-cooling module is higher than a first threshold, the first sensor generates a first signal and sends it to the controller, and the controller closes the liquid return valve after receiving the first signal; and when the liquid level of the coolant in the liquid-cooling module is lower than a second threshold, the first sensor generates a second signal and sends it to the controller, and the controller opens the liquid return valve after receiving the second signal.

In some embodiments, the vapor processing part further includes a second sensor connected to the controller and configured to detect the gas pressure in the vapor processing part; wherein, when the gas pressure is greater than a third threshold, the second sensor generates a third signal and sends it to the controller, and the controller opens the pressure relief valve after receiving the third signal to depressurize.

In some embodiments, the liquid collecting part further includes a third sensor connected to the controller and configured to detect the liquid level of the coolant in the liquid collecting part, wherein when the liquid level of the coolant in the liquid collecting part is lower than a fourth threshold, the third sensor generates a fourth signal and sends it to the controller, and the controller generates an alarm signal after receiving the fourth signal, warning that the coolant needs to be filled.

In some embodiments, each liquid-cooling module further includes a maintenance end cap that closes when the liquid-cooling module is in operation.

In some embodiments, the circulation portion further includes a first cooling pipe and a second cooling pipe; wherein, the first cooling pipe and the second cooling pipe are connected to the condenser, and the first cooling pipe is used to transport the coolant in the condenser to the outside, and the second cooling pipe is used to transport the external coolant to the condenser.

In some embodiments, the first cooling pipe and the second cooling pipe are connected to an external heat exchange apparatus.

In some embodiments, the heat exchange apparatus is a dry cooler, a cooling tower, or a chilled water system for a building.

In some embodiments, the coolant is cooling water.

In some embodiments, the connector is a quick plug-in device.

In some embodiments, the coolant is a fluorinated liquid.

With the above technical solutions in the embodiments of the present disclosure, the following advantages may be achieved: with the liquid-cooled server chassis according to the present disclosure, if it is desired to perform maintenance to a single server, it is only necessary to power off the server in operation, and close the gas outlet valve and the liquid return valve, and pull out the liquid-cooling module, and then the server can be taken out to perform separately maintenance or replacement without affecting the operation of other servers. In addition, the condenser is installed outside the liquid-cooling module, and thus the coolant cannot contaminate the server, increasing the reliability of the chassis.

The above summary is for the purpose of illustration only and is not intended to be limiting in any way. In addition to the illustrative aspects, embodiments, and features described above, further aspects, embodiments, and features of present disclosure will be readily apparent by reference to the drawings and the following detailed description.

BRIEF DESCRIPTION OF THE DRAWINGS

In the drawings, the same reference numerals denote the same or similar parts or elements throughout all the drawings unless otherwise specified. The drawings are not necessarily drawn to scale. It should be understood that these drawings depict only some embodiments disclosed in accordance with present disclosure and should not be construed as limiting the scope of present disclosure.

DETAILED DESCRIPTION

Figure 1:
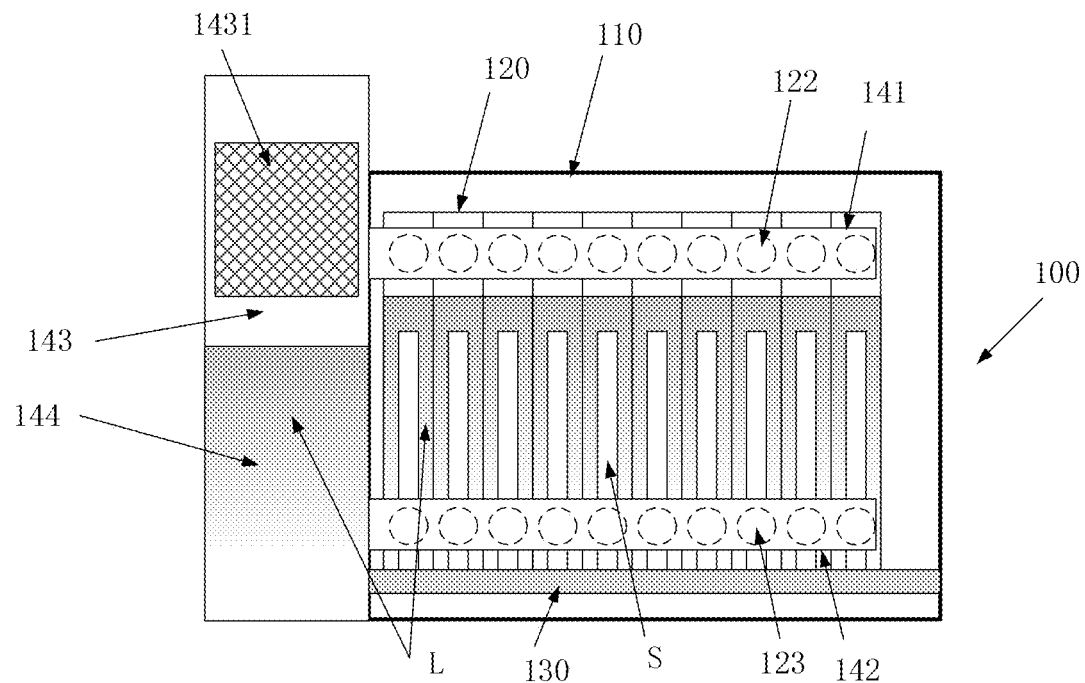
FIG. 1 is a schematic cross-sectional view of a liquid-cooled server chassis according to a first embodiment of the present disclosure.

In the following, only certain embodiments are briefly described. As can be recognized by those skilled in the art, various modifications may be made to the described embodiments without departing from the spirit or scope of present disclosure. Therefore, the drawings and the description are substantially regarded as exemplary intrinsically rather than restrictive.

In the description of the present disclosure, it is to be understood that the terms "center", "longitudinal", "transverse", "length", "width", "thickness", "up", "down", "front", "rear", "left", "right", "vertical", "horizontal", "top", "bottom", "inner", "outer", "clockwise", "counterclockwise", "axial", "radial", "circumferential", etc. indicate the orientation or positional relationship which is based on the orientation or positional relationship shown in the drawings, and is merely for convenience of describing the present disclosure and simplification of the description, and does not indicate or imply the indicated device or elements must have a particular orientation, be constructed and operated in a particular orientation, and therefore should not be construed as limitations to the disclosure.

In addition, the terms "first" and "second" are used for descriptive purposes only and are not to be construed as indicating or implying relative importance or implicitly indicating the number of indicated technical features. Thus, features defining "first" and "second" may explicitly or implicitly include at least one of the features. In the description of the present disclosure, "a plurality of" means two or more, unless expressly limited otherwise.

In the present disclosure, the terms "mounting", "connecting", "connecting", "fixing" and the like should be understood in a broad sense unless specifically defined or limited. For example, it may be a fixed connection or a detachable connection. Or integrated; can be mechanical or electrical, it can also be communication; can be directly connected, but also indirectly through the intermediary, it can be the internal communication of two components or the interaction between two components. Those of ordinary skill in the art can understand the specific meanings of the above terms in the present disclosure according to specific circumstances.

In the present disclosure, the "first" or "lower" of the first feature in the second feature may include the first and second feature direct contact, and may also include the first and second features, unless expressly specified or limited. Not in direct contact but through other features between them. Also, the first feature "above", "square", and "above" the second feature includes the first feature directly above and diagonally above the second feature, or merely indicating that the first feature is higher in height than the second feature. The first feature "below", "below", and "below" the second feature includes the first feature directly above and diagonally above the second feature, or merely indicating that the first feature is less horizontal than the second feature.

The following disclosure provides many different embodiments or examples for implementing different structures of the present application. In order to simplify the disclosure of the present application, the components and settings of specific examples are described below. Of course, they are merely examples and it is not intended to limit the present disclosure. In addition, the present disclosure may repeat reference numerals and/or reference letters in different examples. This repetition is for the purpose of simplification and clarity and does not itself indicate the relationship between the various embodiments and/or settings discussed. In addition, the present disclosure provides examples of various specific processes and materials, but one of ordinary skill in the art may be aware of applications of other processes and/or use of other materials.

FIG. 1 is a schematic cross-sectional view of a liquid-cooled server chassis according to a first embodiment of the present disclosure. As shown in FIG. 1, the liquid-cooling server chassis 100 includes:

a case 110, one or more liquid-cooling modules 120, a connector 130, and a circulation portion.

The case 110 houses all components of the case therein, and an upper portion or side portion thereof may be provided with a cover (not shown) so that an operator may open the cover to inspect the components in the case 110 or replace a component.

Figure 2:
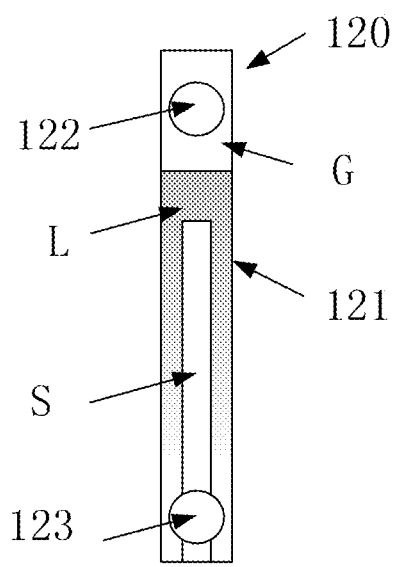
FIG. 2 is a schematic sectional view of a liquid-cooling module according to a first embodiment of the present disclosure.

One or more liquid-cooling modules 120 are disposed within the case 110. FIG. 2 shows a single liquid-cooling module including a housing 121, a gas outlet valve 122, and a liquid return valve 123, with a single server S is immersed into coolant L.

When the liquid-cooling module 120 is in operation, the server S is completely immersed into the coolant L, and the gas outlet valve 122 and the liquid return valve 123 are opened. Generally, the coolant is a non-conductive liquid with a low boiling point. Preferably, the coolant may be a fluorinated liquid. The fluorinated liquid is stable in performance, does not react with active materials such as metals, plastics, and elastomers, and has excellent non-conductive and insulating properties no matter whether it is at high temperatures or at low temperatures. Thus it can be widely used to cool electronic devices. In the present disclosure, the type of the fluorinated liquid is not specifically limited.

The connector 130 is configured to connect the liquid-cooling module to a power supply. The type of connector 130 is not specifically limited in the present disclosure. Preferably, the connector 130 may be a quick plug-in device, such as a power strip, to enable quick insertion and removal of the liquid-cooling module 120.

The circulation portion includes a gas outlet pipe 141, a liquid return pipe 142, a vapor processing part 143, and a liquid collecting part 144.

As shown in FIG. 1, the gas outlet pipe 141 is disposed above the liquid-cooling module. The gas outlet valve 122 of each liquid-cooling module 120 is connected to the gas outlet pipe 141, while the liquid return valve 123 of each liquid-cooling module 120 is connected to the liquid return pipe 142 disposed below the liquid-cooling module 120. In the figure, the gas outlet valve 122 and the gas outlet valve 123 is hidden by the gas outlet pipe 141 and the liquid return pipe 142, and both of them are shown in dotted lines in FIG. 1 for ease of description.

When the chassis 100 is in operation, the liquid-cooling module 120 is plugged to the connector 130, and the gas outlet valve 122 and the liquid return valve 123 are opened. The connector 130 is connected to an external power source to supply power to the liquid-cooling module 120 and the server S. With the operation of the server S, temperature of the internal chip gradually rises to reach the boiling point of the coolant L. At this point, the coolant is vaporized and heat from the chip and other parts of the server is taken away by the latent heat. A bubble of vaporized coolant rises from below the coolant and diffuses to the gas part G in an upper portion of the liquid-cooling module (as shown in FIG. 2), and then passes through the gas outlet valve 122 into the gas outlet pipe 141 of the circulation portion. The bubble, together with the vaporized coolant generated by other liquid-cooling modules is sent to the vapor processing part 143. A condenser 1431 is disposed in the vapor processing part 143 and configured to condense the vaporized coolant back into coolant. The re-condensed coolant droplets fall into the liquid collecting part 144 and may be transferred to the liquid return valve 123 of each liquid-cooling module through the liquid return pipe 142 and enter the liquid-cooling module through the valve, so as to complete the circulation of the coolant.

Ten liquid-cooling modules are shown in FIG. 1. It can be understood that other numbers of liquid-cooling modules may be provided in the case 110 depending on actual requirements, and the size of the case 110 may also be changed accordingly. And thus the size and power of the condenser also need to be adjusted accordingly. Therefore, according to actual requirements of environment, cases with different sizes may be provided, wherein the cases contains different numbers of liquid-cooling modules and condensers of different sizes and powers. For example, in a large-scale data center, a very large number of servers are used, so a larger chassis may be provided, which contains dozens or even hundreds of liquid-cooling modules, while including a relatively high-power condenser. For a common user, it is possible to provide a small chassis that contains a small number of liquid-cooling modules and a relatively low-power condenser.

In the present disclosure, by means of the circulation portion, a circulation of the may be completed in the chassis, which improves the utilization of the coolant.

The condenser 1431 may be condenser of any type, for example, a condensation tray, and it is not specifically defined herein.

If it is necessary to maintain a single server, then this server may be turned off. Meanwhile, the liquid-cooling module 120 in which the server is immersed is disconnected from the connector 130, and then the gas outlet valve 122 and the liquid return valve 123 of the liquid-cooling module 120 are closed. After that, the liquid-cooling module 120 may be taken out of the case 110. At this point, the other servers are still in operation normally and are not affected. After taking out the liquid-cooling module 120, the server S may be taken out from the coolant for maintenance or replacement.

When reinstalling the server S, the serviced or replaced server may be re-disposed in the liquid-cooling module 120, and the gas outlet valve 122 and the liquid return valve 123 of the liquid-cooling module 120 may be re-connected to the chassis and opened as well. At this time, according to a principle of liquid level pressure balance, the coolant in the liquid collecting part 144 will pass through the liquid return pipe 142 and enter the liquid-cooling module 120 via the liquid return valve 123. After a height of the coolant satisfies the requirements of the server, the liquid-cooling module 120 may be connected to the connector 130 and re-powered to operate normally.

It can be seen that with the liquid-cooled server chassis according to the present disclosure, a single server may be maintained without affecting other servers. Moreover, the condenser is disposed outside the liquid-cooling module, so that the server may be protected from the contamination of the coolant in the condenser.

In particular, the coolant may be cooling water.

Figure 3:
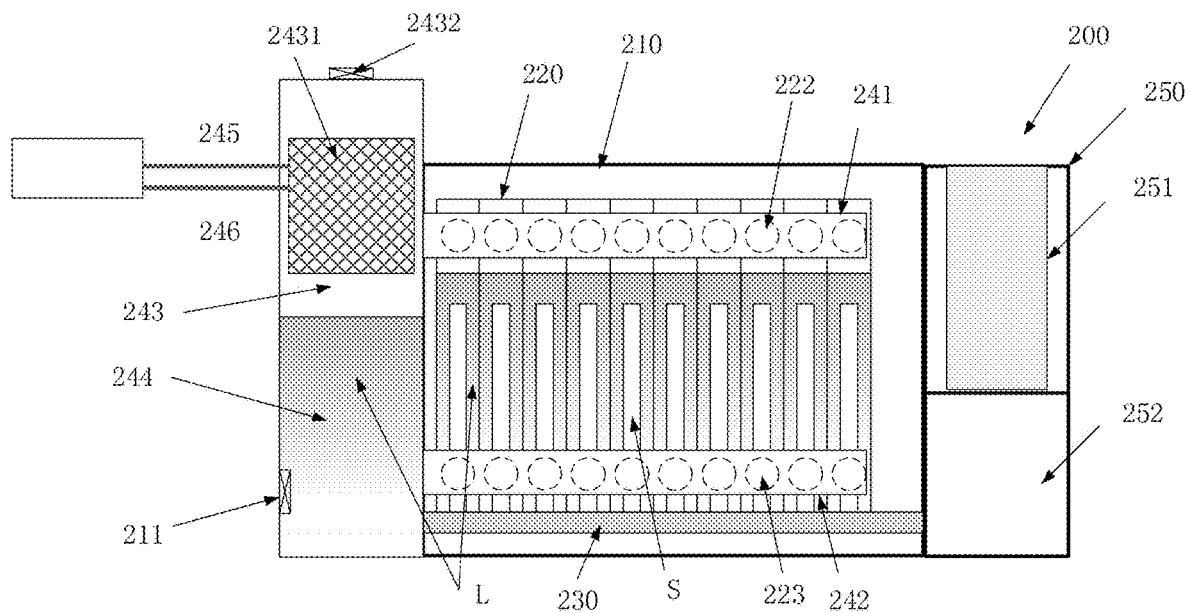
FIG. 3 is a schematic cross-sectional view of a liquid-cooled server chassis according to a second embodiment of the present disclosure.

FIG. 3 shows a schematic cross-sectional view of a liquid-cooled server chassis 200 according to a second embodiment of the present disclosure. Identical parts of the chassis 200 with those of the chassis 100 will not be described herein again, and only the differences therebetween will be specifically described.

Figure 4:
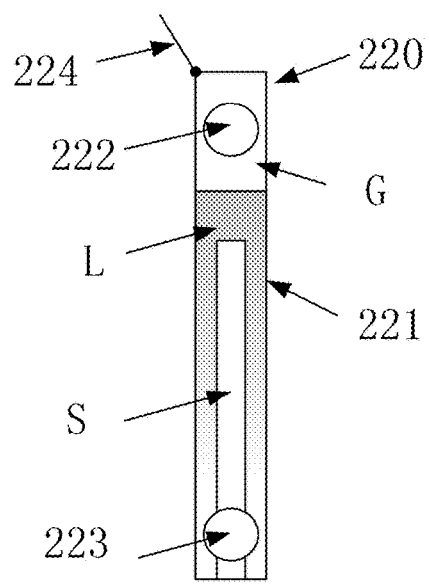
FIG. 4 is a schematic sectional view of a liquid-cooling module according to a second embodiment of the present disclosure.

In the chassis 200, as shown in FIG. 4, the liquid-cooling module 220 further includes a maintenance cover 224, which is closed when the liquid-cooling module is in operation. In this way, if it is required to maintain a server, part of the coolant will leak when the cover of the chassis is opened and a liquid-cooling module is taken out. However, only the coolant in this particular liquid-cooling module 220 will leak, and coolant or vaporized coolant from other liquid-cooling modules will not be leak.

As shown in FIG. 3, the circulation portion of the cabinet 200 may further include a first cooling pipe 245 and a second cooling pipe 246, which are both connected to the condenser 2431 and an external heat exchange apparatus. Herein, the first cooling pipe transports hot coolant in the condenser 2431 to the external heat exchange apparatus, and the second cooling pipe transports new coolant from the external heat exchange apparatus to the condenser 2431, thereby performing the replacement of the coolant.

In the present disclosure, the heat exchange apparatus is disposed outside the chassis 200, but it can be understood that the heat exchange apparatus may also be included in the chassis 200. In addition, the heat exchange apparatus may be of any type, such as a dry cooler, a cooling tower or a chilled water system for a building.

In addition, chassis 200 also includes a power and control system 250. As shown in FIG. 3, the power and control system 250 includes the power supply 251 and a controller 252. The power supply 251 is connected to the connector 230 to power the chassis 200 via the connector 130. The controller is connected to the liquid-cooling modules and the circulation portion to control them. For example, the opening and closing of the various valves of the liquid-cooling module 220, and the valves of the liquid-cooling module 220 may be controlled by the controller to be opened or closed, such that the chassis 200 may be operated more conveniently.

Preferably, as shown in FIG. 3, the case 210 may further include a liquid-filling valve 211 connected to the liquid collecting part 244. Through the liquid-filling valve 211, the liquid-collecting part 244 may be supplemented with coolant, so as to avoid opening the chassis to perform filling of coolant, which is convenient to the user.

In addition, sometimes, too much vaporized coolant may be generated by the server such that the server cannot be cooled timely and effectively. At this time, the pressure in the vapor processing part 243 will rise, which will affects the cooling effect, and may even damage the condenser 2431. For this purpose, the vapor processing part 143 preferably includes a pressure relief valve 2432. Through the pressure relief valve 2432, the vapor processing part 243 may be depressurized, avoiding a problem caused by an excessive pressure.

The vapor may be discharged to the external environment by depressurizing, but preferably may be recovered by an air bag (not shown). Moreover, the recovered vapor may be re-cooled into coolant, which thereafter, may also be re-filled into the liquid-collecting part through the liquid-filling valve 211 for recycling, improving the utilization of coolant. It can be understood that the air bag may also be contained within the chassis. In this case, the air bag may be connected to a cooling device, or a cooling device may be disposed inside the air bag. After the vapor in the air bag is cooled into coolant, the air bag may be connected to the liquid-filling part by another pipeline for recycling usage.

Figure 5:
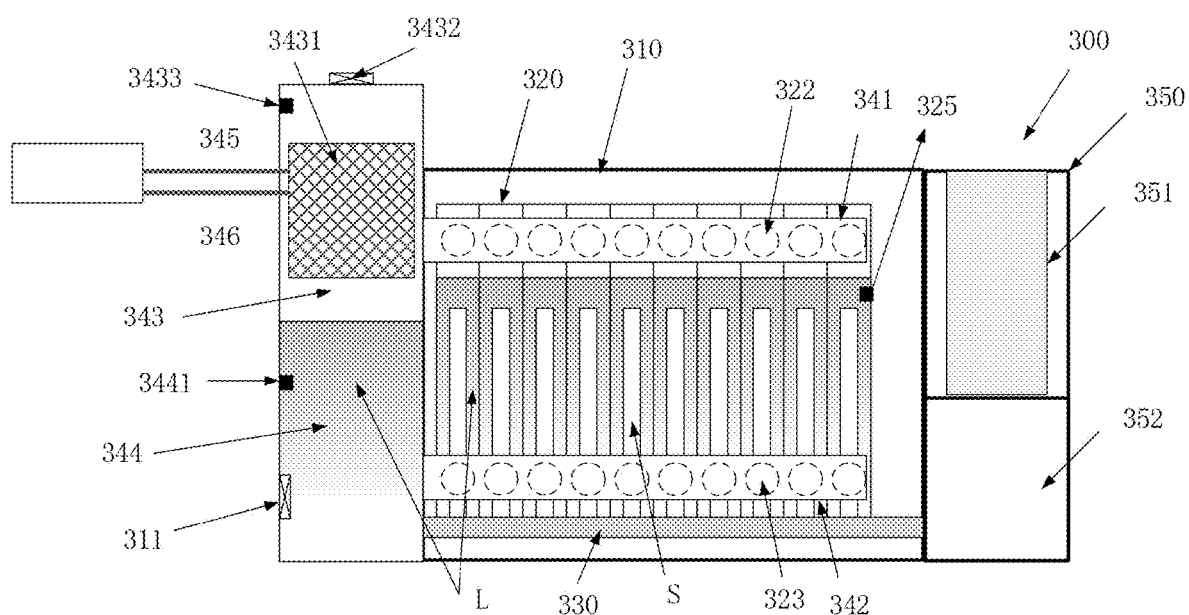
FIG. 5 is a schematic cross-sectional view of a liquid-cooled server chassis according to a third embodiment of the present disclosure.

FIG. 5 shows a schematic cross-sectional view of a liquid-cooled server chassis 300 according to a third embodiment of the disclosure. The chassis 300 differs from the chassis 200 shown in FIG. 2 in that the liquid-cooling module 320, the vapor processing part 343, and the liquid collecting part 344 of the chassis 300 may include a sensor respectively. In addition to that, the rest of the chassis 300 is identical with that of the chassis 200 and therefore will not be described again.

It can be understood that sensor may be disposed in at least one of the above three components, which is not limited in the present disclosure. For illustration, the above three components of the chassis 300 each includes a sensor in FIG. 4, and the sensors are represented by a first sensor 325, a second sensor 3433, and a third sensor 3441 respectively.

The first, second, and third sensors 325, 3433, and 3441 are all connected to the controller 352, and they each may be of any type such as a contact-type depth sensor, a pressure sensor, etc. Moreover, it can be understood that the sensor may also be a non-contact sensor (such as a laser sensor, an infrared sensor, etc.) disposed on a wall of the chassis.

The first sensor 325 is disposed within a liquid-cooling module 320 for detecting the liquid level of the coolant in the liquid-cooling module 320. After the server is maintained and reinserted into the liquid-cooling module 320, the liquid-cooling module 320 will be re-filled with coolant. When the first sensor 325 detects that the liquid level of the coolant in the liquid-cooling module 320 exceeds a first threshold, it will generate a first signal and send it to the controller 352. The controller 352 will close the liquid return valve 323 according to the signal and stop the coolant from entering. Also, if the first sensor 325 detects that the liquid level in the liquid-cooling module 320 is lower than a second threshold, it will generate a second signal and send it to the controller 352. The controller 352 will open the liquid return valve according to the signal, and supplement coolant for the liquid-cooling module. In this way, the liquid level of the coolant in the liquid-cooling module may be maintained within a certain range. The first and second thresholds are predetermined according to the amount of coolant required to cool the server.

The second sensor 3433 is disposed in the vapor processing part 343 for detecting the vapor pressure in the vapor processing part 343. When it detects that the vapor pressure exceeds a third threshold, it will generate a third signal and send it to the controller 352. The controller will open the pressure relief valve 3433 according to the signal and depressurize the vapor processing part 343.

The third sensor 3441 is disposed in the liquid collecting part 344 for detecting the liquid level of the coolant in the liquid collecting part 344. When it detects that the liquid level falls below a fourth threshold, it will generate a signal and send it to the controller 352. The controller 352 will generate an alarm signal according to the signal for reminding that the coolant needs to be filled. Then coolant may be filled through a liquid filling port 311 to avoid a problem due to lack of coolant.

Herein, the third and fourth threshold may be predetermined according to actual requirements, and are not specifically limited in the present disclosure.

The foregoing descriptions are merely specific embodiments of the present disclosure, but not intended to limit the protection scope of the present application. Those skilled in the art may easily conceive of various changes or modifications within the technical scope disclosed herein, all these should be covered within the protection scope of the present application. Therefore, the protection scope of the present application should be subject to the protection scope of the claims.

What is claimed is:

1. A liquid-cooled server chassis, comprising:
    a case;
    one or more liquid-cooling modules, each liquid-cooling module comprising a housing, a gas outlet valve, and a liquid return valve, wherein the gas outlet valve and the liquid return valve are opened during operation of the liquid-cooling module, and the liquid-cooling module accommodates a single server and is filled with coolant during operation;
    a connector configured to connect the liquid-cooling modules to a power supply; and
    a circulation portion comprising a gas outlet pipe, a liquid return pipe, a vapor processing part, and a liquid collecting part,
    wherein:
    the gas outlet pipe is connected to the gas outlet valve of each liquid-cooling module and is configured to transfer gas from the liquid-cooling module to the vapor processing part;
    the liquid return pipe is connected to the liquid return valve of each liquid-cooling module and is configured to transfer liquid from the liquid collecting part to the liquid-cooling module;
    the vapor processing part is connected to the gas outlet pipe and includes a condenser, the condenser being configured to condense vapor into condensed liquid by cooling the vapor in the vapor processing part; and
    the liquid collecting part is disposed below the vapor processing part and connected to the liquid return pipe, and configured to collect the condensed liquid from the vapor processing part.

2. The server chassis of claim 1, further comprising: a power and control system, wherein the power and control system comprises a controller configured to control the liquid-cooling modules and the circulation portion, and the power supply is configured to supply power to the chassis via the connector.

3. The server chassis of claim 2, wherein each liquid-cooling module further comprises a first sensor connected to the controller and configured to detect the liquid level of coolant in the liquid-cooling module;
    wherein upon detection that the liquid level of coolant in the liquid-cooling module is higher than a first threshold, the first sensor generates a first signal and sends the generated first signal to the controller, and the controller closes the liquid return valve after receiving the generated first signal; and
    wherein upon detection that the liquid level of coolant in the liquid-cooling module is lower than a second threshold, the first sensor generates a second signal and sends the generated second signal to the controller, and the controller opens the liquid return valve after receiving the generated second signal.

4. The server chassis of claim 2, wherein the liquid collecting part further comprises a third sensor connected to the controller and configured to detect the liquid level of coolant in the liquid collecting part,
    wherein upon detection that the liquid level of coolant in the liquid collecting part is lower than a fourth threshold, the third sensor generates a fourth signal and sends the generated fourth signal to the controller, and the controller generates an alarm signal to prompt a supplement of coolant after receiving the fourth signal.

5. The server chassis of claim 2, wherein the vapor processing part further comprises a pressure relief valve, and the vapor in the vapor processing part can be discharged to outside through the pressure relief valve.

6. The server chassis of claim 5, wherein the pressure relief valve is connected to an external air bag for collecting gas discharged through the pressure relief valve.

7. The server chassis of claim 5, wherein the vapor processing part further comprises a second sensor connected to the controller and configured to detect a vapor pressure in the vapor processing part;

wherein upon detection that the vapor pressure is greater than a third threshold, the second sensor generates a third signal and sends the generated third signal to the controller; and the controller opens the pressure relief valve after receiving the generated third signal, to depressurize the vapor processing part.

8. The server chassis of claim 1, wherein the case further comprises a liquid filling valve connected to the liquid collecting part, to supplement the liquid collecting part with the coolant.

9. The server chassis of claim 1, wherein each liquid-cooling module further comprises a maintenance cover that is closed during operation of the liquid-cooling module.

10. The server chassis of claim 1, wherein the circulation portion further comprises a first cooling pipe and a second cooling pipe;

wherein the first cooling pipe and the second cooling pipe are connected to the condenser, and the coolant in the condenser is transferred to outside through the first cooling pipe, and the coolant from outside is transferred to the condenser through the second cooling pipe.

11. The server chassis of claim 10, wherein the first cooling pipe and the second cooling pipe are connected to an external heat exchange apparatus.

12. The server chassis of claim 11, wherein the external heat exchange apparatus is selected from the group consisting of a dry cooler, a cooling tower, and a chilling water system for a building.

13. The server chassis of claim 10, wherein the coolant is cooling water.

14. The server chassis of claim 1, wherein the connector is a plug-in device configured to permit insertion and removal of the liquid-cooling module.

15. The server chassis of claim 1, wherein the coolant is fluorinated liquid.

* * * * *